(12) United States Patent
Xue et al.

(10) Patent No.: US 7,737,695 B2
(45) Date of Patent: Jun. 15, 2010

(54) HIGH FIELD MAGNETIC RESONANCE IMAGING APPARATUS AND METHOD FOR OBTAINING HIGH SIGNAL-TO-NOISE BY ITS RECEIVING COIL

(75) Inventors: Ting Qiang Xue, Shenzhen (CN); Jian Min Wang, Shenzhen (CN); Zeng He He, Shenzhen (CN); Yang Wang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 94 days.

(21) Appl. No.: 12/037,223

(22) Filed: Feb. 26, 2008

(65) Prior Publication Data

US 2008/0204019 A1      Aug. 28, 2008

(30) Foreign Application Priority Data

Feb. 28, 2007      (CN) .................... 2007 1 0064091

(51) Int. Cl.
   *G01V 3/00* (2006.01)
(52) U.S. Cl. .................. 324/318; 600/415
(58) Field of Classification Search .......... 324/318, 324/322; 600/415, 422
   See application file for complete search history.

(56) References Cited

U.S. PATENT DOCUMENTS

| 5,057,777 | A | * | 10/1991 | Kurczewski | ............ 324/318 |
|---|---|---|---|---|---|
| 5,329,924 | A | * | 7/1994 | Bonutti | ............ 600/415 |
| 5,483,159 | A | * | 1/1996 | Van Heelsbergen | ......... 324/318 |
| 5,500,595 | A | * | 3/1996 | Burton | ............ 324/318 |
| 5,543,710 | A | * | 8/1996 | Jones | ............ 324/318 |
| 5,706,813 | A | * | 1/1998 | Filler et al. | ............ 600/422 |

* cited by examiner

*Primary Examiner*—Louis M Arana
(74) *Attorney, Agent, or Firm*—Schiff Hardin LLP

(57) ABSTRACT

In a high field magnetic resonance imaging apparatus and a method for obtaining signals having a high signal-to-noise ratio with the receiving coil thereof, the apparatus has at least a basic magnet and a receiving coil, the basic magnet generating a basic magnetic field, and the receiving coil being disposed within the basic magnetic field and forming an accommodating cavity. The accommodating cavity of the receiving coil is perpendicular to the direction of the basic magnetic field and is positioned in the field of view of the apparatus. The receiving coil is a loop type coil. The apparatus can further have a bracket for fixing the receiving coil. In the method, a receiving coil is used to receive signals in a magnetic field, wherein the receiving coil is perpendicular to the direction of the magnetic field. By using the apparatus and the corresponding method since the receiving coil can have a loop type design, the signal-to-noise ratio is increased. Moreover, the receiving coil can be disposed at a position closer to the center of the field of view, so that the imaging quality is improved.

8 Claims, 4 Drawing Sheets

HIGH FIELD MAGNETIC RESONANCE IMAGING APPARATUS AND METHOD FOR OBTAINING HIGH SIGNAL-TO-NOISE BY ITS RECEIVING COIL

BACKGROUND OF THE INVENTION

1. Field of the Invention

The present invention relates to a magnetic resonance imaging (MRI) apparatus, and particularly to a high field magnetic resonance imaging apparatus and a method for obtaining a high signal-to-noise ratio by a receiving coil thereof.

2. Description of the Prior Art

Magnetic resonance imaging is an imaging technology for obtaining the internal structural information of an object by means of the magnetic resonance phenomena. MRI is broadly used in the field of medical imaging due to its significant advantages, such as a large number of imaging parameters, high resolution, tomography in any layer required, non-destructive imaging, etc.

In a middle or low field MRI apparatus (basic magnetic field=0.5T), the direction of the basic magnetic field is perpendicular to the patient's limb in a receiving coil. A radio frequency (RF) receiving coil is usually a loop (i.e. loop type) coil, such as a single loop coil shown in FIG. 1, or a solenoid coil shown in FIG. 2 or a Helmholtz coil pair, etc. In a high field MRI apparatus (basic magnetic field=1.5T), since the patient's limb is parallel to the horizontal direction of the basic magnetic field, the RF receiving coil can only have a cage type or a surface loop coil structure, and the receiving coil of the surface loop coil structure is shown in FIG. 3. However, in practical applications, the signal-to-noise ratio (SNR) achievable by an RF receiving coil of the cage type or the surface loop structure is lower than that of a loop type RF receiving coil.

FIG. 4 shows a schematic view of the example of a wrist coil used in a high field MRI apparatus in the prior art. FIG. 5 shows a case of the application of the magnetic resonance imaging to a patient's wrist in the prior art, wherein the patient is lying on a bed 503 with the wrist to be scanned in a receiving coil 502, and the receiving coil 502 is positioned beside the patient's body and within the magnetic field generated by a basic magnet 501. FIG. 6 shows another case of the application of the magnetic resonance imaging to a patient's wrist in the prior art, wherein the patient is lying on a bed 603 with the wrist to be scanned in a receiving coil 602, and the receiving coil 602 is positioned beyond the patient's head and within the magnetic field generated by a basic magnet 601.

It can be clearly seen from FIGS. 5 and 6 that the patient's limb is parallel to the horizontal direction of the basic magnetic field, so the wrist coil can only have a surface loop coil, so its SNR is lower than that of a loop type wrist coil.

Moreover, in the case as shown in FIG. 5, since the patient's limb is placed flat beside his or her body, the wrist coil is nearly beyond the field of view (abbreviated as FOV) of the MRI apparatus. In the case as shown in FIG. 6, the receiving coil 602 and the patient's wrist are positioned beyond and to one side of the patient's head. Although the location of the receiving coil 602 in the case as shown in FIG. 6 is slightly better than that of the receiving coil 502 shown in FIG. 5, it is still not ideal, and the patient in this position is not comfortable, therefore it is not suitable to keep this position for a long time.

Generally, the MRI apparatus and method in the prior art have the following disadvantages:

1) due to the differences in the relationships of the patient's limb with the direction of the basic magnetic field and the manners of positioning the receiving coil between a middle or low field MRI and a high field MRI, a loop type receiving coil cannot be used in an current high field MRI apparatus;

2) the receiving coil for a high field MRI apparatus can only be of a case type or a surface loop structure, which cannot achieve a high SNR;

3) the specific position of a wrist coil is nearly beyond the FOV of the MRI apparatus; and 4) the specific position of the wrist coil affects the comfort of a patient when having an MRI operation.

SUMMARY OF THE INVENTION

An object of the present invention is to provide a high field MRI apparatus and a method for improving the SNR of a receiving coil thereof, so as to obtain a SNR that is higher than that of the RF receiving coil of a cage type or a surface loop structure adopted in the high field MRI apparatus in the prior art.

This object is achieved in accordance with the present invention by a high field magnetic resonance imaging apparatus having at least a basic magnet and a receiving coil, wherein the basic magnet generates a basic magnetic field, the receiving coil is positioned within the basic magnetic field and forms an accommodating cavity. In the apparatus according to the present invention, the accommodating cavity of the receiving coil is perpendicular to the direction of the basic magnetic field.

In the apparatus according to the present invention, the receiving coil is a loop type coil. Furthermore, the receiving coil can be used as a wrist coil.

The apparatus according to the present invention can further have a bracket with the receiving coil is fixed on the bracket.

In the apparatus according to the present invention, whether or not having the bracket described above, the receiving coil is always positioned within the field of view of the magnetic resonance imaging apparatus.

The above object also is achieved in accordance with the present invention by a method for obtaining a high signal-to-noise ratio with a receiving coil of a high field magnetic resonance imaging apparatus, in which a receiving coil is used to receive signals in a basic magnetic field, wherein the receiving coil is arranged perpendicularly to the direction of the basic magnetic field.

In the method according to the present invention, the receiving coil is disposed in the field of view of the magnetic resonance imaging apparatus.

Compared with the prior art, the present invention has the following advantages:

1) the receiving coil in the high field MRI apparatus has a loop type design, so the SNR is improved;

2) the receiving coil is located at a position closer to the FOV, and the imaging quality is improved because here the uniformity of the basic magnetic field is better;

3) by simple modification of an existing loop type coil used in a middle or low field MRI apparatus and by necessary adjustments to its RF, a novel wrist coil suitable for a high field MRI apparatus can be developed in a short time; and 4) an improved SNR is achievable by using a plurality of coils and an advanced decoupling technique, which at the same time increases the range of imaging and improves the uniformity of images.

DESCRIPTION OF THE PREFERRED EMBODIMENTS

The basis of the present invention is to change the manner of positioning a patient's limb from being parallel to the direction of the basic magnetic field, as in the prior art; to positioning the patient's limb perpendicular to the direction of the basic magnetic field, so that a loop type coil can be used as the receiving coil, so as to achieve a relatively high SNR.

In the present invention the direction of a wrist coil is turned by 90°, so that the basic magnetic field generated by a basic magnet is perpendicular to the direction of the patient's limb, thus a loop type coil, such as a single loop coil, a solenoid coil, a Helmholtz pair, etc., can be used as the receiving coil.

In the present invention a material meeting certain requirements by an application environment is used to make a bracket for supporting and positioning of the receiving coil. One manner for realizing the bracket is to make it from a non-ferromagnetic and insulating material of good MRI compatibility, for example, epoxy glass-fiber reinforced plastics, thermoplastic or thermosetting plastics, etc., and the width and height of the bracket is adjustable according to a patient's build.

Figure 1:
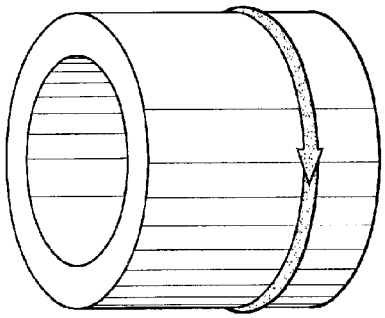
FIG. 1 is a schematic view of a single loop coil as the receiving coil.
Figure 2:
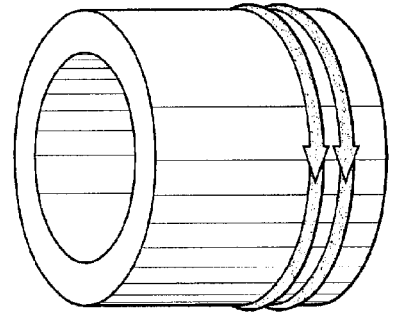
FIG. 2 is a schematic view of a solenoid coil as the receiving coil.
Figure 3:
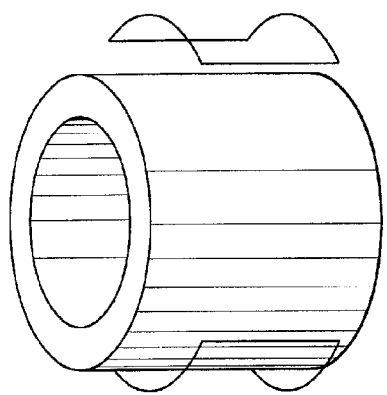
FIG. 3 is the schematic view of the receiving coil with a surface loop structure.
Figure 4:
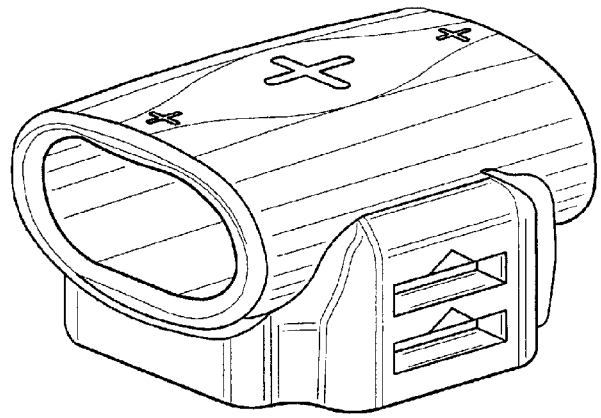
FIG. 4 is the schematic view of an example of a wrist coil used in a high field MRI apparatus in the prior art.
Figure 5:
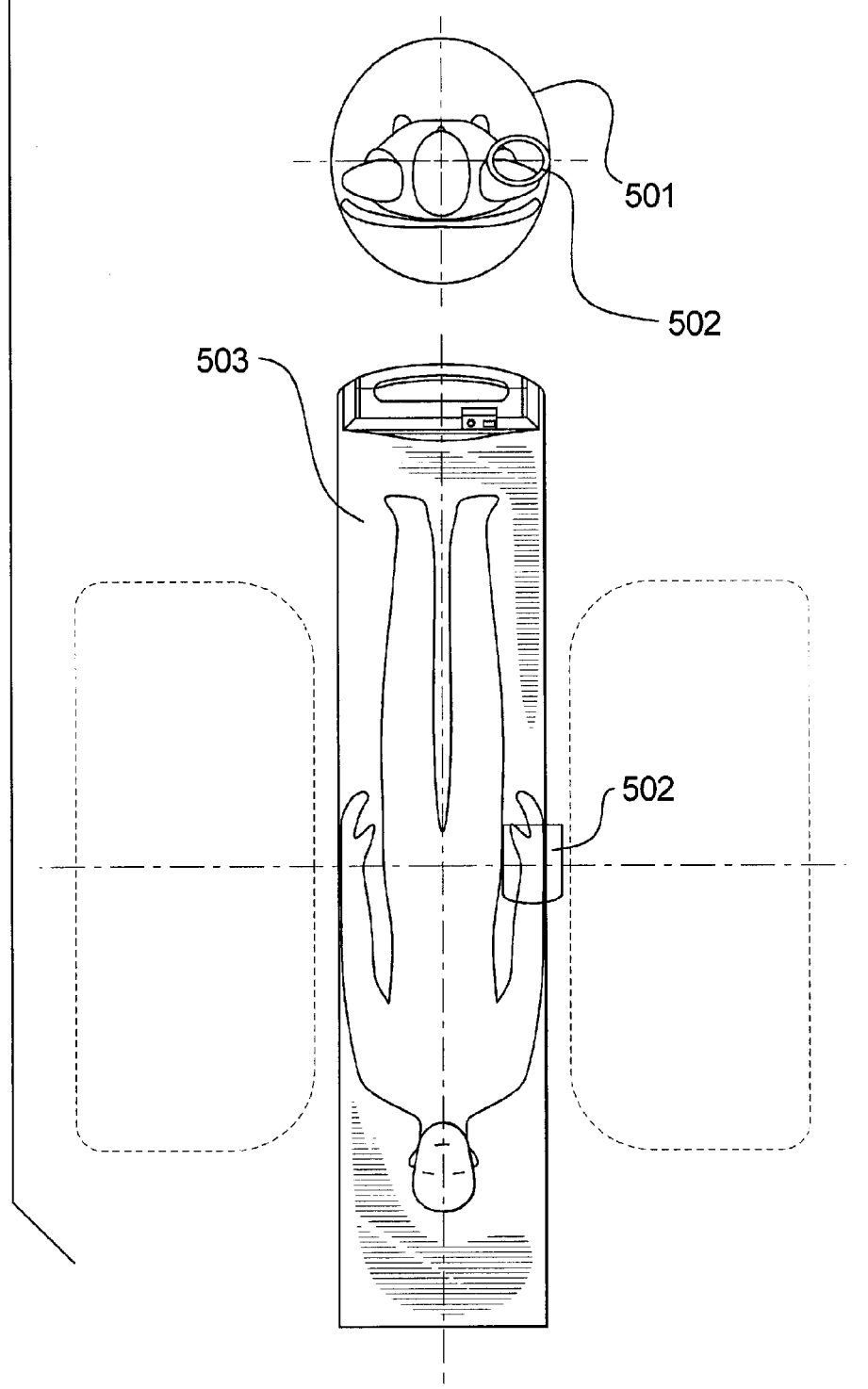
FIG. 5 is a schematic view of the pose of a patient and the position of a wrist coil in the prior art.
Figure 6:
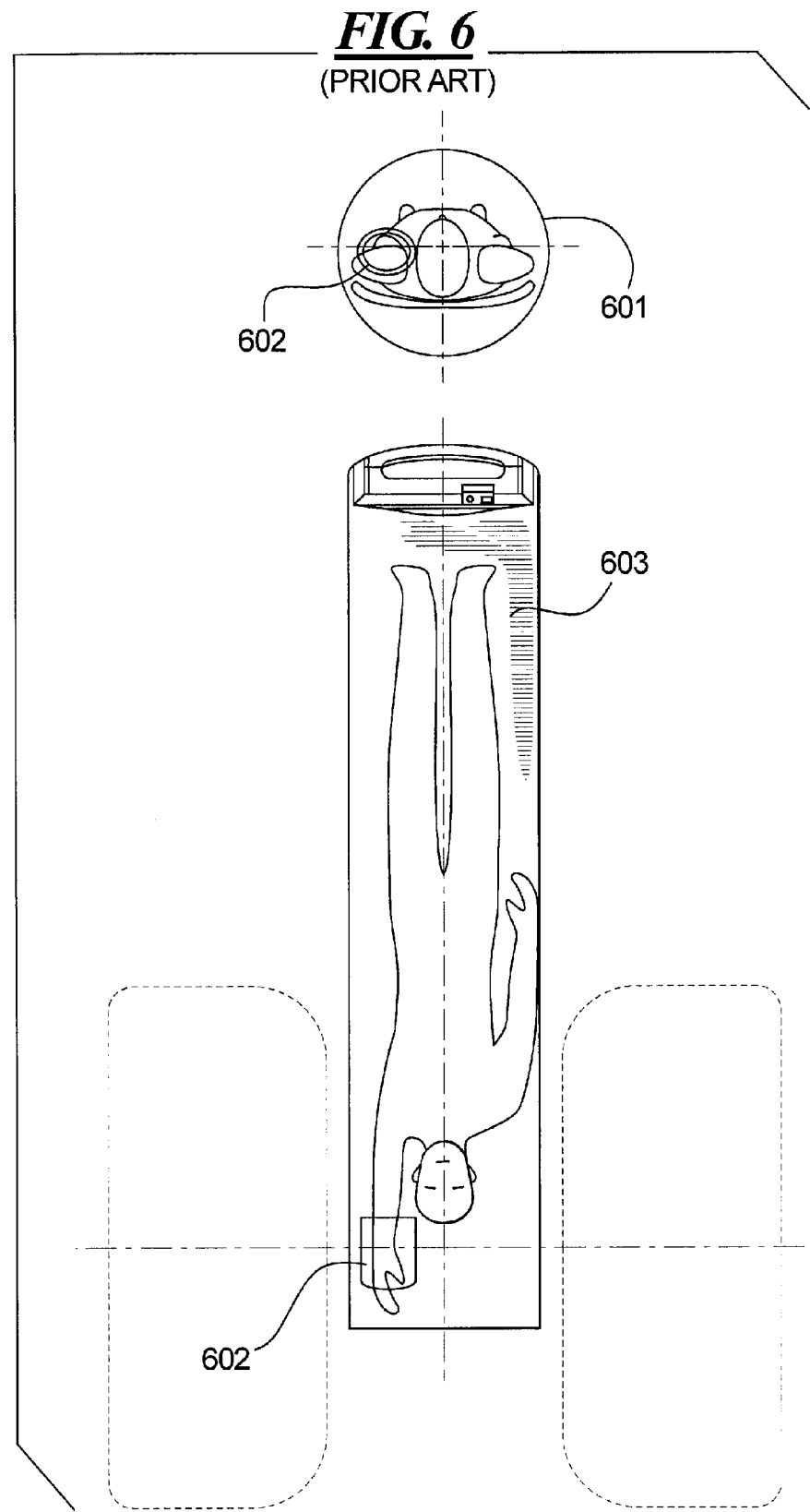
FIG. 6 is the schematic view of another pose of a patient and the position of a wrist coil in the prior art.
Figure 7:
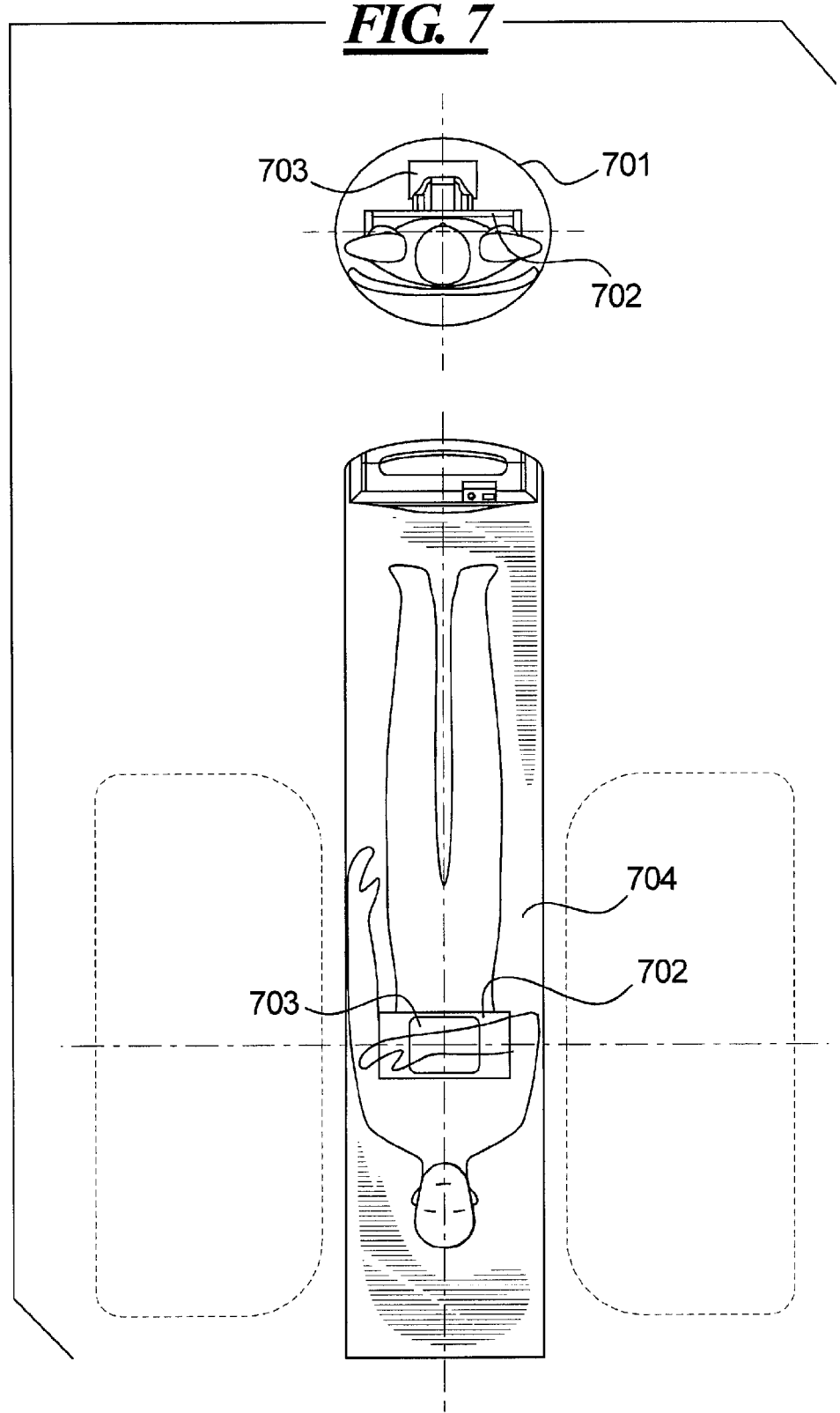
FIG. 7 is the schematic view of an embodiment of the apparatus according to the present invention, in which a wrist coil is arranged on the abdomen of a patient.

FIG. 7 shows a schematic structural illustration of the embodiment of the present invention, wherein a wrist coil is disposed on a patient's abdomen, and the whole high field magnetic imaging apparatus includes:

a basic magnet 701 for generating the basic magnetic field for magnetic resonance imaging;

a receiving coil 703 having a structure is designed as an cavity for accommodating the patient's limb to be imaged, and the direction of the accommodating cavity is perpendicular to that of the basic magnetic field, so as to receive signals sent out from the patient's limb to be imaged during the scanning by the apparatus; and a patient bed 704 for the patient to conveniently get into and out of the basic magnetic field generated by the basic magnet 701 during a magnetic resonance imaging process, and for providing a comfortable imaging environment for the patient.

As can be seen from FIG. 7, when the receiving coil 703 is used as a wrist coil, the receiving coil 703 is moved from the positions beside the patient, as in the prior art, to above the patient's abdomen, and the direction of the receiving coil has also been turned by 90°. Therefore, the receiving coil of the present invention for the imaging of a wrist part differs from the receiving coil for a wrist part in the prior art, in that its direction and position in the basic magnetic field make the limb to be imaged, which is accommodated in the accommodating cavity thereof, perpendicular to the direction of the basic magnetic field, and therefore, a loop type coil can be used.

In addition, with the receiving coil 703 disposed on the patient's abdomen after having been turned 90°, when it is used as a wrist coil for scanning the patient's wrist, the patient's arm bends naturally and the wrist can be placed in the accommodating cavity of the wrist coil, and at this time, the patient's pose kept is more comfortable than in the wrist coil of the prior art, and it would be endurable by a patient for a longer period of time.

As can also be seen from FIG. 7, when the receiving coil is used as the wrist coil, the abdomen of the patient lying on the bed 704 is within the basic magnetic field generated by the basic magnet 701, and when the receiving coil is placed above the patient's abdomen, the direction of the accommodating cavity of the receiving coil 703 is perpendicular to that of the basic magnetic field.

To ensure the good positioning of the coil during the imaging process for the patient's wrist, and to provide to the patient a more comfortable imaging environment, it is better for the receiving coil not to be placed directly on the patient's abdomen, for this reason, a bracket 702 is designed for positioning the receiving coil in the present invention.

As shown in FIG. 7, the bracket 702 not only avoids the heavy load of the receiving coil on the patient, but also ensures a stable arrangement of the receiving coil 703, so as to avoid any concern about the slight movements of the patient's body, which would cause the receiving coil to move with it and in turn affect the imaging quality. This bracket 702 is put above of the patient's abdomen with its two ends standing on the bed 704 after the patient has lain on the bed 704. A certain gap remains between the plate of the bracket 702 for arranging the receiving coil 703 and the abdomen of the patient, which avoids the load on the patient's abdomen.

In order to make it possible for patients of different body builds to lie down on the bed 704 in a comfortable pose when performing MRI in the same MRI apparatus, the bracket 702 designed in the present invention is adjustable according to the body build of a patient lying on the bed 704. By adjusting the width and the height of the bracket 702, it is made to suit different body builds of the patients on the bed 704.

Since the internal physical information of the patient's limb is acquired by the resonance phenomena in the MRI apparatus, and the bracket 702 itself is also positioned in the magnetic field generated by the basic magnet 701, the material for making the bracket 702 needs to meet certain requirements. The basic characteristics of the material are to be non-ferromagnetic, electric insulative, and of good MRI compatibility, in practical applications it can be made of materials, such as epoxy glass-fiber reinforced plastics, thermoplastic or thermosetting plastics, etc.

In the present invention it is due to the positioning of the receiving coil 703 at a place close to the center of the basic magnetic field, such as on the patient's abdomen, etc. that the receiving coil 703 and the limb to be imaged in its accommodating cavity are positioned near the central position within the FOV of the MRI apparatus. The basic magnetic field generated near the central position of the FOV of the MRI apparatus by the basic magnet 701 has a better uniformity which improves the imaging quality, and in contrast the wrist coil in the prior art is paced beside the patient at locations nearly beyond the FOV of the MRI apparatus. Moreover, by using a number of coils and an advanced decoupling technique, the SNR can be improved, and at the same time the imaging range can be increased, and the uniformity of the images improved.

Based on the apparatus described above, the present invention also provides a method for improving the SNR of the receiving coil of a high field MRI apparatus, wherein a receiving coil is used in a magnetic field for receiving signals, and the receiving coil is perpendicular to the direction of the basic magnetic field.

The method according to the present invention is described according to the high field MRI apparatus as shown in FIG. 7. The high field MRI apparatus mainly has a basic magnet 701 and a receiving coil 703. The basic magnet 701 serves to generate a basic magnetic field and the receiving coil 703 is configured as an accommodating cavity for holding the limb to be imaged for receiving the signals sent out from the patient's limb to be imaged. The receiving coil 703 is perpendicular to the direction of the magnetic field generated by the basic magnet 701.

The receiving coil 703 uses a loop type coil, such as a single loop coil, a solenoid coil, a Helmholtz pair, etc., so that when the receiving coil 703 is located within the range of the magnetic field generated by the basic magnet, it is disposed in a direction and at a position so as to make the limb hold in the accommodating cavity perpendicular to the direction of the basic magnetic field.

When the receiving coil 703 according to the present invention is used as a wrist coil for imaging a patient's wrist part, the direction of the accommodating cavity of the receiving coil is perpendicular to that of the basic magnetic field, so as to make the limb stay in the accommodating cavity perpendicular to the direction of the basic magnetic field.

When the receiving coil 703 according to the present invention is designed to be used as a wrist coil, the receiving coil 703 is also located above the patient's abdomen by a bracket 702, so as to avoid the discomfort caused to the patient by disposing the receiving coil 703 directly on the patient's abdomen, which also-affects imaging quality.

As to the loop type wrist coils currently used in the middle or low field MRI apparatus, by making some necessary modifications to their RF, for example, by changing their receiving frequency to a receiving frequency corresponding to a high field MRI apparatus, and by keeping their original structural parts such as shell, etc. and electronic elements, a novel wrist coil suitable to a high field MRI apparatus can be developed within a short period of time.

By disposing the receiving coil of the present invention at the locations close to the center of the basic magnetic field, such as on the patient's abdomen, etc., it causes the receiving coil, and the limb to be imaged in the accommodating cavity thereof, to be positioned near the central position in the FOV of the MRI apparatus and it improves the imaging quality. Moreover, by using a number of coils and an advanced decoupling technique, the SNR can be improved, and at the same time, the imaging range can be increased and the uniformity of the image improved.

Although modifications and changes may be suggested by those skilled in the art, it is the intention of the inventors to embody within the patent warranted hereon all changes and modifications as reasonably and properly come within the scope of their contribution to the art.

We claim as our invention:

1. A high field magnetic resonance imaging apparatus comprising:
   a basic field magnet that generates a basic magnetic field in a basic magnetic field direction, said basic field magnet being configured to receive an examination subject therein having a wrist; and
   a wrist reception coil configured for replacement around the wrist of the subject to receive magnetic resonance signals from the wrist of the subject, said reception coil being disposed in said basic magnetic field and having a coil configuration forming an accommodating cavity for said wrist; and
   a bracket to which said wrist reception coil is mounted, said bracket being configured to hold said wrist coil over the abdomen of the subject while said reception coil receives said magnetic resonance signals, said accommodating cavity being perpendicular to said basic magnetic field direction.

2. An apparatus as claimed in claim 1 wherein said wrist reception coil is a loop coil.

3. An apparatus as claimed in claim 1 wherein said basic magnetic field generated by said basic field magnet defines an imaging volume, and wherein said bracket holds said wrist reception coil is located in said imaging volume.

4. An apparatus as claimed in claim 1 wherein said bracket is configured to hold said wrist coil, with the wrist of the subject therein, at a distance spaced from a surface of the abdomen of the patient.

5. A method for obtaining a high signal-to-noise ratio signal from a reception coil of a high field imaging apparatus, comprising the steps of:
   generating a basic magnetic field, in a basic magnetic field direction, in a magnetic resonance apparatus;
   placing an examination subject in said basic magnetic field;
   placing a wrist reception coil around a wrist of the examination subject;
   orienting said wrist reception coil perpendicularly to said basic magnetic field direction on the abdomen of the subject; and
   receiving magnetic resonance signals from the subject with said reception coil.

6. A method as claimed in claim 5 comprising employing a loop coil as said wrist reception coil.

7. A method as claimed in claim 5 comprising, with said basic magnetic field, defining an imaging volume, and locating said wrist reception coil in said imaging volume.

8. A method as claimed in claim 5 comprising supporting said wrist coil with the wrist of the subject therein with a bracket spaced a distance above a surface of the abdomen of the subject.

* * * * *